(12) United States Patent
Kopanoglu et al.

(10) Patent No.: US 11,885,863 B2
(45) Date of Patent: Jan. 30, 2024

(54) SIMULTANEOUS USE OF JOINT AND INDIVIDUAL INFORMATION TERMS IN MULTICONTRAST COMPRESSIVE SENSING RECONSTRUCTION

(71) Applicant: ASELSAN ELEKTRONIK SANAYI VE TICARET ANONIM SIRKETI, Ankara (TR)

(72) Inventors: Emre Kopanoglu, Ankara (TR); Alper Gungor, Ankara (TR); Huseyin Emre Guven, Ankara (TR); Tolga Cukur, Ankara (TR)

(73) Assignee: ASELSAN ELEKTRONIK SANAYI VE TICARET ANONIM SIRKETI, Ankara (TR)

( * ) Notice: Subject to any disclaimer, the term of this patent is extended or adjusted under 35 U.S.C. 154(b) by 674 days.

(21) Appl. No.: 17/047,728

(22) PCT Filed: Apr. 18, 2018

(86) PCT No.: PCT/TR2018/050172
§ 371 (c)(1),
(2) Date: Oct. 15, 2020

(87) PCT Pub. No.: WO2019/203738
PCT Pub. Date: Oct. 24, 2019

(65) Prior Publication Data
US 2021/0116528 A1 Apr. 22, 2021

(51) Int. Cl.
*G01R 33/561* (2006.01)
*G06T 5/50* (2006.01)
*G06T 11/00* (2006.01)

(52) U.S. Cl.
CPC ............ *G01R 33/5611* (2013.01); *G06T 5/50* (2013.01); *G06T 11/006* (2013.01); *G06T 2207/10088* (2013.01)

(58) Field of Classification Search
CPC .............. G01R 33/5611; G01R 33/561; G01R 33/5608; G06T 5/50; G06T 11/006;
(Continued)

(56) References Cited

U.S. PATENT DOCUMENTS 9,336,611 B2 * 5/2016 Bilgic .................... A61B 5/055
2013/0182930 A1 7/2013 Trzasko et al.
2016/0063739 A1 * 3/2016 Weizman ........... G01R 33/4835
382/131

OTHER PUBLICATIONS

Xu, Zheng, Yeqing Li, Leon Axel, and Junzhou Huang. "Efficient preconditioning in joint total variation regularized parallel MRI reconstruction." In Medical Image Computing and Computer-Assisted Intervention—MICCAI 2015: 18th International Conference, pp. 563-570. Springer International Publishing (Year: 2015).*

(Continued)

*Primary Examiner* — Ross Varndell
*Assistant Examiner* — Emmanuel Silva-Avina
(74) *Attorney, Agent, or Firm* — Bayramoglu Law Offices LLC (57) ABSTRACT

A method to reconstruct images from raw MRI data, and recover an image by solving an optimization problem. Hence, the method is an image reconstruction system for image recovery contrary to similar methods, the method reconstructs all images using both joint and individual objective functions. The method includes: acquiring with the MRI system, multiple images under an influence of different contrast mechanisms, wherein the different contrast mechanisms belong to a same anatomy, solving an optimization problem with an optimization algorithm using both joint and individual objective functions simultaneously for each of multiple image contrasts or a subset of the multiple image contrasts, to reconstruct the multiple images from acquired data.

12 Claims, 2 Drawing Sheets (58) Field of Classification Search
CPC ........ G06T 2207/10088; A61B 5/0033; A61B 5/055; G16H 30/40
USPC .......................................................... 382/100
See application file for complete search history.

(56) References Cited

OTHER PUBLICATIONS

Emmanuel J Candes et al., Robust Uncertainty Principles: Exact Signal Reconstruction From Highly Incomplete Frequency Information, IEEE Transactions on Information Theory, 2006, pp. 489-509, vol. 52, No. 2.

Michael Lusting, et al., Sparse MRI: The Application of Compressed Sensing for Rapid MR Imaging, Magnetic Resonance in Medicine, 2007, pp. 1182-1195, 58.

Angshul Majumdar et al., Joint reconstruction of multiecho MR images using correlated sparsity, Magnetic Resonance Imaging, 2011, pp. 899-906, 29.

Berkin Bilgic et al., Multi-contrast Reconstruction With Bayesian Compressed Sensing, Magnetic Resonance in Medicine, 2011, pp. 1601-1615, 66.

Junzhou Huang et al., Fast multi-contrast MRI reconstruction, Magnetic Resonance Imaging, 2014, pp. 1344-1352, 32.

Florian Knoll et al., Joint MR-PET Reconstruction Using a Multi-Channel Image Regularizer, IEEE Transactions on Medical Imaging, 2017, pp. 1-16, vol. 36, No. 1.

Junfeng Yang et al., A Fast Alternating Direction Method for TVL1-L2 Signal Reconstruction From Partial Fourier Data, IEEE Journal of Selected Topics in Signal Processing, 2010, pp. 288-297, vol. 4, No. 2.

Junzhou Huang et al., Efficient MR Image Reconstruction for Compressed MR Imaging, 2010, pp. 136-142.

Shiqian Ma et al., An Efficient Algorithm for Compressed MR Imaging using Total Variation and Wavelets, IEEE, 2008, pp. 1-8.

H Emre Guven et al., An Augmented Lagrangian Method for Complex-Valued Compressed SAR Imaging, IEEE Transactions on Computational Imaging, 2016, pp. 235-250, vol. 2, No. 3.

Antonin Chambolle, Total Variation Minimization and a Class of Binary MRF Models, Jun. 2005, pp. 1-19.

X Bresson et al., Fast Dual Minimization of The Vectorial Total Variation Norm and Applications to Color Image Processing, 2008, pp. 1-27.

Lior Weizman et al., Joint Multicontrast MRI Reconstruction, pp. 1-2.

* cited by examiner

SIMULTANEOUS USE OF JOINT AND INDIVIDUAL INFORMATION TERMS IN MULTICONTRAST COMPRESSIVE SENSING RECONSTRUCTION

CROSS REFERENCE TO THE RELATED APPLICATIONS

This application is the national stage entry of International Application No. PCT/TR2018/050172, filed on Apr. 18, 2018, the entire contents of which are incorporated herein by reference.

TECHNICAL FIELD

The present invention relates to an image recovery method comprising simultaneous use of individual and joint information terms in multi-contrast compressive sensing reconstruction.

The image recovery method may be used in medical imaging such as MR, PET, CT images or in other fields such as Hyperspectral imaging.

BACKGROUND

Magnetic Resonance Imaging (MRI) is an imaging modality that enables high resolution imaging of soft tissues. Imaging protocols used for imaging affect the contrast between tissues and the brightness of the image. Therefore, most clinical applications require data acquisition using multiple protocols (multi-contrast MRI). However, data acquisition with multiple protocols leads to rather long scan times. In this scope, compressive sensing image reconstruction techniques that allows reconstruction of high quality images using fewer number of data samples is used for MRI data acquisition. Compressive sensing is a signal processing technique that was first proposed in 2005 [1]. It has been first applied to compressive MRI reconstruction in 2007 [2]. Compressive multi-contrast MRI problem has been proposed after that, and multiple solutions have been developed [3-6]. All these methods are optimization based, and each relies on a different technique. SparseMRI is the first study in this area, and uses a very slow optimization technique called "Conjugate Gradient (CG)" [2]. It processes all contrast images individually, and solves a regularized optimization problem that includes a linear combination of l1-norm and Total Variation (TV) constrains.

RecPF, like SparseMRI, reconstructs each image separately [7]. Although the solved optimization problem is similar to sparseMRI, RecPF relies on "Alternating Direction Method of Multipliers (ADMM)" as the optimization method to solve the problem. For this reason RecPF can reconstruct images faster than SparseMRI. Additionally, the isotropic definition of V, sum of squares of gradients, is used in RecPF, which ultimately helps reconstruct images faster than SparseMRI. Additionally, the isotropic definition of TV, sum of squares of gradients, is used in RecPF, which ultimately helps reconstruct better images.

The method in reference [4] jointly processes multi-contrast images. The technique relies on Bayesian Compressed Sensing. The method reconstructs gradients in two directions separately, then combines them and reconstructs images.

FCSA-MT jointly reconstructs multiple images [5]. For the joint processing, it relies on an algorithm proposed in the paper called "Fast Composite Splitting Algorithm". Contrary to previous methods, it solves an optimization problem including joint total variation and joint l1-norm. Hence, data from each contract image can be used to improve the quality of other images.

Briefly, the previous techniques can be divided into two groups, the algorithms that reconstruct multiple images jointly and, the algorithms that reconstruct multiple images individually. The most basic problem of the algorithms that use individual reconstruction is the ignoring of the common information across different contrast MR images. These techniques cannot fully utilize the gathered data to recover the best possible image reconstruction results. The techniques that employ joint reconstruction are not preferred for two main reasons:

Longer reconstruction times
Leakages of features across different contrast images Joint processing of different contrast images can lead much longer reconstruction times compared to individual counterparts. Besides, conventional imaging techniques require negligible reconstruction times. For the compressed sensing techniques to be employed in clinic, the total required time for compressed methods (scanning time of the patient and total reconstruction time) should be less than the conventional imaging time (scanning time of patient and reconstruction time using conventional methods). However, previous joint reconstruction techniques do not satisfy this criteria.

When joint reconstruction is employed, sometimes a feature unique to one contrast may leak into another contrast. Such a leakage of features across images are misleading in clinical diagnosis. The previous techniques do not propose any precaution against such leakage of features, prohibiting clinical application.

SUMMARY

Present invention relates to an image recovery method comprising simultaneous use of individual and joint information terms in multi-contrast compressive sensing reconstruction. Compressive sensing is used in MRI data acquisition because it allows reconstruction of high quality images using fewer number of data samples. MRI data acquisition via compressive sensing can lead to 50% to 90% reduction in scan times per patient. However, compressed sensing image reconstruction techniques require very high computational power, requiring longer image reconstruction times. Because each reconstructed image provides the technician information on how to proceed, the effective imaging time in practice includes both data acquisition and image reconstruction. The extended image reconstruction times reduce the effective reduction in scan times, and also, hinder clinical application of compressed sensing techniques.

In this scope, main object of the invention is provide a solution to the problem of image recovery from compressed multi-contrast MRI data. Proposed method can reconstruct images in clinically feasible times in addition to reducing the required scanning time.

The proposed method reconstructs all images using both joint and individual objective functions. This simultaneous utilization of both joint and individual features allows the proposed method to have many advantages over conventional methods. The method maximizes the exploitation of the common information across different contrast images while preserving individual features. This is a critical feature of the method that allows clinical application.

While the previous methods assume that the mean brightness of different contrast images are similar, this assumption does not hold for many applications. The proposed method does not have such an assumption.

Previous methods assume equal acceleration of data acquisition for all contrasts. However, acquiring data for different contrasts commonly require different scan times. Therefore, unequal acceleration of different contrasts can be more advantageous in terms of reduction of the total scan time. For example, data gathering process of a T2-weighted image may take longer than that of a T1-weighted image. In this case, T2-weighted image data can be gathered with a lower acceleration rate in a longer period of time. This allows further reduction of the total data acquisition time compared to using an equal acceleration rates to acquire the same total amount of data. So, the proposed method can reconstruct better images by adjusting special coefficient associated with the acceleration rate, and also prevent leakage of features across contrasts.

Previous compressed multi-contrast MRI reconstruction techniques that perform joint reconstruction are not compatible with the broadly used parallel imaging techniques. For parallel imaging, sensitivity maps that are created by each individual coil in the field of view is required. The proposed method can either work with previously calculated sensitivity maps, or with previously unknown sensitivity maps by estimating the maps. The proposed method can also handle multi-contrast data from multiple channels, and reconstruct image in a computationally efficient way. Here, our invention includes how parallel imaging can be applied in the context of the proposed technique. Although parallel imaging with compressed sensing is not novel, the application of parallel imaging within the context of the proposed method is novel.

DETAILED DESCRIPTION OF THE EMBODIMENTS

In scope of the invention an image recovery method comprising simultaneous use of individual and joint information terms in multi-contrast compressive sensing reconstruction is provided. Said method is used in a Magnetic Resonance Imaging (MRI) system for reconstruction of images.

An MRI system comprises a magnet that produces a static magnetic field, gradient coils for encoding spatial information, RF coils to transmit and receive radiofrequency signals as well as spatial encoding, amplifiers for gradient and radiofrequency fields, digital-to-analog and analog-to-digital converters for gradient and radiofrequency waveforms, a computer that generates the waveforms and synchronizes the waveforms and drives the amplifiers, a receive coil that reads out signal from the selected field of view (FOV), and a computer that process the acquired data to reconstruct images. The reconstruction computer may run commercially available or custom-built operating systems, or include commercially available or custom-built digital signal processing units such as central processing units (CPUs), field-programmable gate arrays (FPGAs) or graphical processing units (GPUs).

The presence of the static magnetic field leads to alignment of part of the spins along the direction of the static magnetic field, commonly referred to as the z-axis. This magnetic field is created using a permanent magnet. Then, a radio frequency (RF) pulse is applied to rotate the aligned spins towards the transverse plane (orthogonal to the z-direction). Tipping (or, flipping) of the spins towards the transverse direction and away from their steady state direction is referred to as excitation. Application of a gradient field perturbation simultaneously with this radiofrequency pulse leads to spatial localization of the excitation. The applied RF pulse is generated using the RF system that generates the pulse, converts it from a digital to an analog signal, amplifies, and transmits through the RF coils.

Then, the magnetization in the transverse direction is measured through the receive chain of the RF system comprising of the receive coil, analog-to-digital converter, amplifier and the reconstruction computer. Depending on the application, gradient perturbations in two-/three-dimensions are added to the magnetic field, and the data is sampled during the gradient perturbations. The gradient fields are generated using the gradient system that digitally generates the gradient pulses, converts to analog signals and amplifies using gradient amplifiers, and transmits using the gradient coils. Gradient coils may be of the form whole-body coils, head-coil or specifically designed for a body part. Any available coil may be used with the described invention.

Finally, the emitted signal becomes:

$$s_r(t) = \int_R m(r) e^{-i2\pi k(t) \cdot r} dr,$$

Where m(r) is the magnetization in the FOV, r is the parameter for volume integral, and $k(t) = \gamma \int_0^t G(s) ds$. The emitted signal is measured using radiofrequency receive coils, and a gradient perturbation, referred to as the readout gradient, may be applied during signal reception. Although the read high-frequency signal is mostly first shifted to baseband, and sampled in the baseband, other sampling procedures may exist. The sampled signal constitute the $s_r(t)$, and this is directly converted to the data y in the described procedure.

Figure 1:
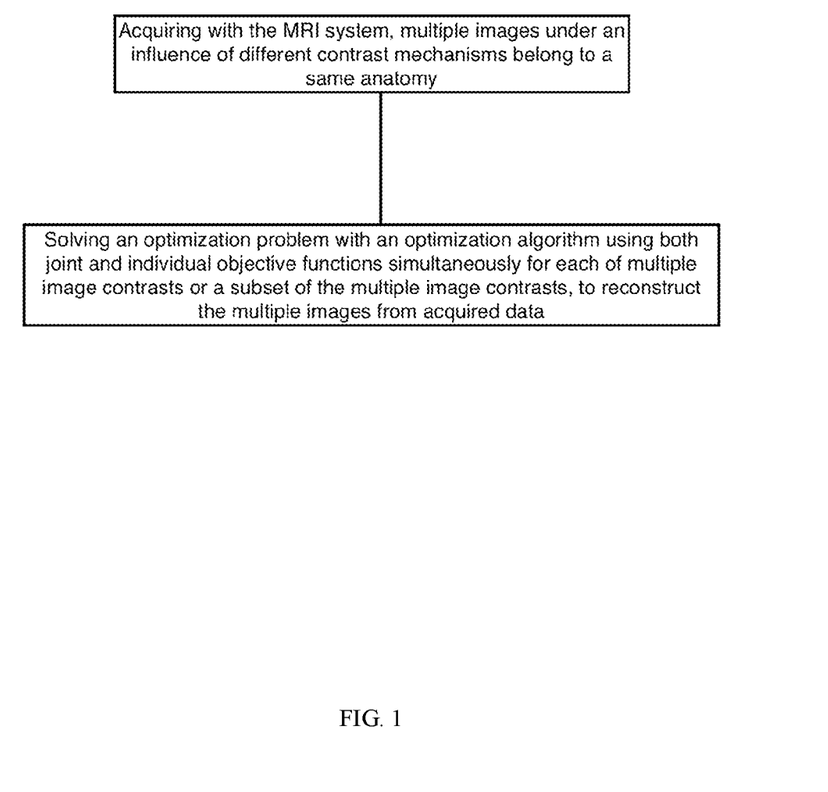
FIG. 1 is a flow chart of an embodiment of the method of the present invention.

Here, once linear gradient perturbations in two-/three-directions are used, the received signal can be expressed as a Fourier transform. Hence, Fourier transformation of the underlying magnetization is sampled in MRI for linear gradients. In the invention, this process is described by using a linear forward model, $A_i = M_i F$, where $M_i$ are the sampled points in Fourier domain (k-space), and F is the Fourier transformation matrix. While this is a convenient approach for linear reconstruction, it is also possible to work with other imaging sequences as well. The pulse sequence thus determines the forward model. The samples of the received signal $y = s_r(t)$ are then used in conjunction with the forward model in the reconstruction which is described below. With reference to FIG. 1, after the raw data is gathered as described above, the data is processed with the method of invention. The method run with the data and solves an optimization problem using both joint and individual features of the image. As a result for each contrast an image is produced. The images are then shown to the technician that started the scan.

The common performance criteria for such techniques include the reconstruction time, and the reconstructed image quality. Although reconstruction time can be measured in a fair way using a computer, there is no well-established quantitative technique to measure for image quality. For this reason, we use visual inspection along with multiple measures for quantitative assessment of the proposed method: root mean squared error (RMSE), mean magnitude error (MME), structural similarity index measure (SSIM), peak-signal-to-noise-ratio (pSNR). The proposed method allows reconstruction of better images in terms of the mentioned measures in shorter time.

The data gathered process should include multiple contrasts that have resemblance characteristics. For example, T1-weighted, T2-weighted and Proton Density (PD) contrast images can be collected. The method also works with a single contrast and can reconstruct quality images. However the main advantage of the method can be seen on multi-contrast images.

There are two basic approaches in scope of the method. While the first method approaches the problem in analysis formulation, the other approaches the problem using both synthesis and analysis formulations.

Let us denote multi contrast MRI data using $y^{(i)} = A_i \cdot x^{(i)}$ vector for each contrast (I). The proposed method reconstructs $x^{(i)}$ in this notation. Firs approach includes two different analysis method.

Analysis Method I

In this method, the type of problem proposed to be solved is;

$$\|A_i \cdot \hat{x}_i - y_i\|_2^2 < \epsilon$$

$$\min_{\hat{x}} \alpha CTV(|\hat{x}|) + \beta GSp(|\hat{x}|) + \sum_i \gamma TV(|\hat{x}_i|) + \sum_i \theta Sp(|\hat{x}_i|)$$

The output of this algorithm $\hat{x}_i$ must satisfy the constraint $\|A_i \cdot \hat{x}_i - y_i\|_2^2 \le \epsilon$ minimize the given objective function. Here $A_i$ denotes the forward model that includes the selected samples from Fourier transformation of the image. However, as will be given in the next section, the matrix can be updated to include the sensitivity maps for parallel imaging.

Here, CTV, GSp, TV, and Sp denote the Color Total Variation, Group Sparsity (12-1-norm), Total Variation and Sparsity (11-norm), respectively. Their definitions are as such:

$$CTV(|x|) = \sqrt{\Sigma_n \Sigma_{i=1}^k ((\nabla_1 |x^{(i)}[n]|)^2 + (\nabla_2 |x^{(i)}[n]|)^2)},$$

$$\|x\|_{2,1} = \Sigma_n \sqrt{\Sigma_{i=1}^k |x^{(i)}[n]|^2},$$

$$TV(|x^{(i)}|) = \Sigma_n \sqrt{(\nabla_1 |x^{(i)}[n]|)^2 + (\nabla_2 |x^{(i)}[n]|)^2},$$

$$\|x^{(i)}\|_1 = \Sigma_n |x^{(i)}[n]|.$$

While the functions CTV and GSp are applied jointly on different contrasts, TV and Sp functions are applied on each contrast image individually. These objectives help impose the logical integrity both across and within each contrast image. Hence, not only higher quality images are acquired for each contrast, but also potential pitfalls such as leakage of features are prevented.

In some cases, some images can be omitted from some objective functions, leading to the objective functions being applied to a subset of the images.

Analysis Method II

Previous studies including joint reconstruction assume each contrast image data is gathered using the same flip-angle or tip-angle, and have similar intensity values. However, this assumption is not correct for most studies. Also, when the acceleration rates among different contrast images are different, the objective functions employed jointly must handle the mismatches. The proposed techniques approach this problem by changing the definitions of CTV and GSp:

$$CTV(|x|) = \Sigma_n \sqrt{\Sigma_{i=1}^k \mu_i ((\nabla_1 |x^{(i)}[n]|)^2 + (\nabla_2 |x^{(i)}[n]|)^2)},$$

$$\|x\|_{2,1} = \Sigma_n \sqrt{\Sigma_{i=1}^k \zeta_i |x^{(i)}[n]|^2},$$

Here $\zeta_i$ and $\zeta_i$ are the scaling parameters. The parameters allow account for the mismatches described above. Also, the effect of the contrast that has more data can be increased using the described scaling. The scaling not only prevents the contrast with less data to corrupt the contrast with more data, but also improve the quality of the contrast with less data using the contrast with more data.

Some example selections of the mentioned parameters here include $$\frac{1}{\text{data\_number}}, \frac{1}{TV(\hat{x}_i)} \text{ or } \frac{1}{\max(\hat{x}_i)}.$$

Such selections help change the balance of different contrasts and help reconstruct higher quality images.

Synthesis Method

The second approach is the synthesis method. Synthesis formulation is a signal reconstruction technique that considers the signal a linear combination of basis atoms of a dictionary. For multi contrast MRI, each contrast consists of a "correlated" and an "independent" part. The problem can be formulated as:

$$\|A_i \cdot (\hat{x}_i^{(1)} + \hat{x}_i^{(2)}) - y_i\|_2^2 < \epsilon$$

$$\min_{\hat{x}_i^{(1)}, \hat{x}_i^{(2)}} \alpha CTV(|\hat{x}^{(1)}|) + \beta GSp(|\hat{x}^{(1)}|) + \sum_i \gamma TV(|\hat{x}_i^{(2)}|) + \sum_i \theta Sp(|\hat{x}_i^{(2)}|)$$

This problem can be solved using ADMM. In this case, two images per contrast is created including a "correlated" parts of the contrast and an "independent" part of the contrast. Because this model is suitable for multi-contrast MRI, not only the image quality for each contrast is improved, but also it bears more potential for various applications because each part of the image enhances individual details within each contrast. As in the case with analysis I, and analysis II methods, scaled versions of CTV and GSp can be employed here.

Compressed Multi-Contrast Parallel Imaging

The proposed method can also handle parallel imaging along with multi-contrast imaging. The scanning time can be further reduced using parallel imaging with compressed sensing. In this model, the sensitivity maps of each coil is assumed to be known. In this case, the problem model ($A_i$) can be updated to include these maps, and more quality images can be acquired.

For all 3 proposed algorithms, 11-norm (Sp(x)), TV, group 12-1-norm (GSp(x)) and CTV functions are used. In addition to or instead of these functions, different functions such as total generalized variation (TGV), 11-norm of the Wavelet transformation of the image can be employed. The critical novelty in our invention is to use joint and individual objective functions together. Changing the functions with similar functions such as the ones described, or adding new similar functions are alternatives that will result in the same invention as ours.

In most reference articles, PD, T1-weighted and T2-weighted images are used as multi-contrast images. However, the proposed technique can be employed for different sequences that has similar structures due to the nature of the imaging process (Different contrast MR sequences, or reconstruction of MR and PET together) [6]. Also, our invention can be employed beyond the application domain of MR imaging. Hyper-spectral imaging, ultrasound imaging, magnetic particle imaging, and Radar MIMO imaging also includes similar problems since multiple contrasts of the same area data is also gathered in such domains. Hence, the proposed technique can be used in the application domains that results in the reconstruction of multiple contrast/channel data together.

Also, in the description, we mentioned gathering data in Fourier domain. However, MRI scanner can scan data in different transformation domains. As long as the mentioned objective functions are used the data gathering process will not change the effect of our invention. Our invention can also be used with other data scanning models.

Moreover, the proposed method may be used in other fields such as Hyperspectral imaging. In hyperspectral imaging, compressive data from many bands are gathered. This data is similar to multi-contrast MR imaging data, and can be jointly reconstructed to improve the reconstruction performance and image quality of all images. Here, as in the case in MRI, a simple compressive sensing forward model matrix is constructed. Then, this matrix and the sampled data are given as inputs to the reconstruction procedure, which then produces an output image.

Proposed optimization problems can be solved using ADMM as the optimization algorithm. However in addition to this, employing different algorithms to solve the proposed problem will result in similar results as our technique. For example, using Conjugate Gradient or Augmented Lagrangian instead of ADMM will not change the described effects of the result.

Figure 2:
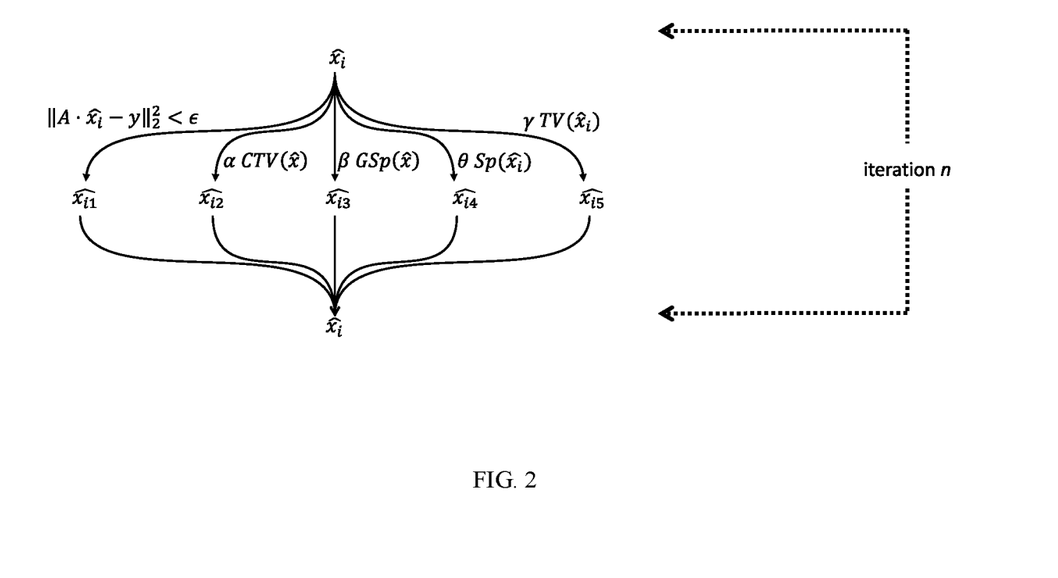
FIG. 2 shows An Algorithm Diagram for an Alternating Direction Method of Multipliers (ADMM).

The ADMM algorithm can be visualized as below;

Reconstructed image $\hat{x}_i$ $$\|A_i \cdot \hat{x}_i - y_i\|_2^2 < \epsilon$$

$$\min_{\hat{x}} \alpha CTV(|\hat{x}|) + \beta GSp(|\hat{x}|) + \sum_i \gamma TV(|\hat{x}_i|) + \sum_i \theta Sp(|\hat{x}_i|)$$

Alternating Direction Method of Multipliers (ADMM) Algorithm Diagram (FIG. 2).

The method is an iterative method that starts from some initial point. At each iteration, a small sub-problem associated with each function is solved, then it is combined with the image vector. The iterations continue until some stopping criteria is met. This criteria can be set as "until the change on the image vector is smaller than some number", or "until some maximum number of iterations.

Algorithm flow diagram is given below. Here, $\phi$ denotes each objective function, while $\Psi$ denotes the solution of the sub-problem associated with each small sub-problem.

| Algorithm Analysis |
| --- |
| 14. Set iteration variable n = 0, choose step size $\mu > 0$ Initialize $z_0^{(i,t)}$, $d_0^{(i,t)}$ |
| 15. Repeat |
| 16. for i = 1 ... k |
| 17. $x_{n+1}^{(i)} = (\mu I + A^{(i)H} A^{(i)})^{-1} (A^{(i)H} (z_n^{(i,0)} + d_n^{(i,0)}) + \Sigma_{t=1}^{m}(z_n^{(i,t)} + d_n^{(i,t)}))$ |
| 18. $z_{n+1}^{(i,0)} = \Psi_{I_{E(\epsilon_i, J_i, y)}(i)} \left( A^{(i)} x_{n+1}^{(i)} - d_n^{(i,0)} \right)$ |
| 19. $d_{n+1}^{(i,0)} = d_n^{(i,0)} + z_{n+1}^{(i,0)} - A^{(i)} x_{n+1}^{(i)}$ |
| 20. end for |
| 21. for t = 1 ... m |
| 22. $\{z_{n+1}^{(i,t)}\}_{i=1...k} = \Psi_{\frac{\alpha_t \phi_t}{\mu}} \left( \{x_{n+1}^{(i)} - d_n^{(i,t)}\}_{i=1...k} \right)$ |
| 23. $d_{n+1}^{(i,t)} = d_n^{(i,t)} + z_{n+1}^{(i,t)} - x_{n+1}^{(i)}$, for all i |
| 24. end for |
| 25. n ← n + 1 |
| 26. Until some stopping criterion is satisfied. |

In the analysis based methods, first the iteration counter n is set to 0, a step size larger than 0 is selected, and initial values of the variables ($z_0$ and $d_0$) are chosen (these can be arrays of zeros, while any alternatives are also valid and possible). Then, the iterations are run. At each iteration, first, the images associated with each objective function are put back together (as in algorithm diagram, the bottom row, shown with arrows), next the computed images are used for minimizing with respect to each objective function separately (as in the top row, Algorithm Diagram). In the first step of the iteration (steps 3-7), each contrast image and its projection are calculated, separately for each contrast. In step 4, dual variables associated with each objective function are summed, and a least squares is performed to calculate the associated contrast image. The matrix inversion step can be computed using the regular matrix inversion. However, in the case that A is a masked unitary transformation (as in the case of MRI), step 4 can be computed efficiently using one forward and one inverse FFT operations [10]. Next, at step 5, a projection onto 12-norm ball is performed, and at step 6, a simple vector addition operation is performed. Next, from steps 8-11, operations associated with each objective function are performed. For each objective function, an associated proximal mapping operation is performed at step 9. These operations solve simple optimization problems, and are mostly straightforward (Chambolle Projection algorithm is used for both TV and CTV proximal mappings, soft thresholding is used for l1-norm proximal mapping, and group-sparsity-soft-thresholding is used for group sparsity proximal mapping, all given below). At step 10, again a simple vector addition is performed. Then, the next iteration begins and the contrast images are computed again as the first step of the next iteration. The stopping criterion here can be set as "until some number of iterations", or as "until the change in each contrast image is small in terms of l2-norm".

| Algorithm Synthesis |
|---|
| 18. Set iteration variable n = 0, choose step size $\mu > 0$, $\alpha_t$, Initialize $z_0^{(i,t)}$, $d_0^{(i,t)}$ for all $i \in \{1, \ldots, k\}$, $t \in \{0, \ldots, 4\}$. |
| 19. Repeat |
| 20.  for i = 1 ... k |
| 21.    $r_n^{(i,1)} = \Sigma_{t=1}^{2} z_n^{(i,t)} + d_n^{(i,t)}$, $r_n^{(i,2)} = \Sigma_{t=3}^{4} z_n^{(i,t)} + d_n^{(i,t)}$, |
| 22.    $q_n^{(i)} = A^{(i)}(r_n^{(i,1)} + r_n^{(i,2)}) + 2(z_n^{(i,0)} + d_n^{(i,0)})$ |
| 23.    $x_1^{(i)} = \frac{1}{2}r_n^{(i,1)} - \frac{1}{8}(A^{(i)})^H q_n^{(i)}$, $x_2^{(i)} = \frac{1}{2}r_n^{(i,2)} - \frac{1}{8}(A^{(i)})^H q_n^{(i)}$, $x_{n+1}^{(i)} = x_1^{(i)} + x_2^{(i)}$ |
| 24.    $z_{n+1}^{(i,0)} = \Psi_{I_{E(\in_i, J, y^{(i)})}}(A^{(i)} x_{n+1}^{(i)} - d_n^{(i,0)})$ |
| 25.    $d_{n+1}^{(i,0)} = d_n^{(i,0)} + z_{n+1}^{(i,0)} - A^{(i)} x_{n+1}^{(i)}$ |
| 26.  end for |
| 27.  for t = 1, 2 |
| 28.    $\{z_{n+1}^{(i,t)}\}_{i=1\ldots k} = \Psi_{\frac{\alpha_t \phi_t}{\mu}}(\{x_1^{(i)} - d_n^{(i,t)}\}_{i=1\ldots k})$ |
| 29.    $d_{n+1}^{(i,t)} = d_n^{(i,t)} + z_{n+1}^{(i,t)} - x_1^{(i)}$, for all i, t |
| 30.    $\{z_{n+1}^{(i,t+2)}\}_{i=1\ldots k} = \Psi_{\frac{\alpha_{t+2} \phi_{t+2}}{\mu}}(\{x_2^{(i)} - d_n^{(i,t+2)}\}_{i=1\ldots k})$ |
| 31.    $d_{n+1}^{(i,t+2)} = d_n^{(i,t+2)} + z_{n+1}^{(i,t+2)} - x_2^{(i)}$, for all i, t |
| 32.  end for |
| 33.  n ← n + 1 |
| 34. Until some stopping criterion is satisfied. |

In the synthesis based method again as in the analysis case, first the iteration counter n is set to 0, a step size larger than 0 is selected, and initial values of the variables ($z_0$ and $d_0$) are chosen (these can be arrays of zeros, while any alternatives are also valid and possible). Iterations follow a similar trend to algorithm diagram, i.e. first the images are put back together to form each contrast image (bottom row, shown with arrows, Algorithm Diagram, FIG. 2) (steps 3-9), and again separated to minimize with respect to each objective function (top row, shown with arrows, algorithm diagram) (steps 10-15). During the first part, at step 4 simple vector additions are performed. At step 5, one forward FFT (or calculation of forward model) and a vector addition is performed. At step 6, two calculations Hermitian operator (or inverse FFT) are performed, along with vector additions. Finally steps 7 and 8 are the same as step 5 and 6 of the analysis based algorithm. As can be seen from the equations, each contrast image is composed of the summation of two separate images, $x_1$ and $x_2$. At step 11, the proximal mapping operators associated with the joint objective functions (CTV and Group sparsity) are performed, while at step 13, the proximal mapping operator associated with the individual objective functions (TV and l1-norm) are performed. Associated operations with the proximal mappings are given after this description. Steps 12 and 14 are simple vector additions. The stopping criterion can be chosen similar to the analysis based algorithm. Here, "$x_1$" corresponds to the "correlated" part of each contrast image, while "$x_2$" corresponds to "independent" part of the image.

Operations related to proximal mappings can be defined as follows:

For $l_1$-norm minimization, the associated operation is soft thresholding:

$$\Psi_{\frac{\alpha_t \phi_t}{\mu}}(x) = \text{soft}(x, a_t/\mu) = \text{sign}(v) \cdot \max\{0, |v| - a_t/\mu\}$$

For $l_{2,1}$-norm (group sparsity) minimization, the associated operation is group sparsity soft thresholding:

$$\Psi_{\frac{\alpha_t \phi_t}{\mu}}(x) = Gsoft(x, a_t/\mu) = \text{sign}(v) \cdot \max\{0, \|v\|_2 - a_t/\mu\},$$

where $\|v\|_2$ is defined as $\sqrt{\Sigma_n |v^{(i)}[n]|^2}$.

For TV minimization, the algorithm given in Chambolle projection [11], may be used. For CTV minimization, the algorithm given in [12] may be used.

REFERENCES

[1] Candes E J, Romberg J, Tao T. Robust uncertainty principles: exact signal reconstruction from highly incomplete frequency information. IEEE Transactions on Information Theory 2006; 52(2):489-509.

[2] Lustig M, Donoho D, Pauly J M. Sparse MRI: The application of compressed sensing for rapid MR imaging. Magnetic Resonance in Medicine 2007; 58(6):1182-1195.

[3] Majumdar A, Ward R K. Joint reconstruction of multi-echo MR images using correlated sparsity. Magnetic Resonance Imaging 2011; 29(7):899-906.

[4] Bilgic B, Goyal V K, Adalsteinsson E. Multi-contrast reconstruction with Bayesian compressed sensing. Magnetic Resonance in Medicine 2011; 66(6):1601-1615.

[5] Huang J, Chen C, Axel L. Fast multi-contrast MRI reconstruction. Magnetic Resonance Imaging 2014; 32(10):1344-1352.

[6] Knoll F, Holler M, Koesters T, Otazo R, Bredies K, Sodickson D. Joint MR-PET reconstruction using a multi-channel image regularizer. IEEE Transactions on Medical Imaging 2016;PP(99):1-1.

[7] Yang J, Zhang Y, Yin W. A Fast Alternating Direction Method for TVL1-L2 Signal Reconstruction From Partial Fourier Data. IEEE Journal of Selected Topics in Signal Processing 2010; 4(2):288-297.

[8] Huang J, Zhang S, Metaxas D. Efficient MR image reconstruction for compressed MR imaging. Medical Image Analysis 2011; 15(5):670-679.
[9] Shiqian M, Wotao Y, Yin Z, Chakraborty A. An efficient algorithm for compressed MR imaging using total variation and wavelets. 2008 23-28 Jun. 2008. p 1-8.
[10] Guven H. E., Gungor, A., Cetin, M. An Augmented Lagrangian Method for Complex-Valued Compressed SAR Imaging. IEEE Transactions on Computational Imaging 2016; 2(3):235-250.
[11] Chambolle A. Total Variation Minimization and a Class of Binary MRF Models. Energy Minimization Methods in Computer Vision and Pattern Recognition: 5th International Workshop, EMMCVPR 2005, St Augustine, FL, USA, Nov. 9-11, 2005 Proceedings. Berlin, Heidelberg: Springer Berlin Heidelberg; 2005. p 136-152.
[12] Bresson, X., Chan, T. F. (2008). Fast Dual Minimization of The Vectorial Total Variation Norm and Applications to Color Image Processing. Inverse Problems and Imaging, 2(4), 455-484.

What is claimed is:

1. A method for reconstructing images of a magnetic resonance imaging (MRI) system comprising the steps of;
   acquiring with the MRI system, multiple images under an influence of different contrast mechanisms, wherein the different contrast mechanisms belong to a same anatomy,
   solving an optimization problem with an optimization algorithm using both joint and individual objective functions simultaneously for each of multiple image contrasts or a subset of the multiple image contrasts, to reconstruct the multiple images from acquired data,
   wherein the optimization problem solved with analysis based methods is as follows;

$$\|A_i \cdot \hat{x}_i - \gamma_i\|_2^2 < \epsilon$$

$$\min_{\hat{x}} \alpha CTV(|\hat{x}|) + \beta GSp(|\hat{x}|) + \sum_i \gamma TV(|\hat{x}_i|) + \sum_i \theta Sp(|\hat{x}_i|)$$

where $A_i$ denotes a transformation matrix, wherein the transformation matrix maps samples of an image to the samples in a data domain, and the data domain comprises a Fourier domain, $\hat{x}_i$ denotes a reconstructed image, and $\hat{y}_i$ denotes associated acquired data for each of the multiple image contrasts; CTV, GSp, TV, and Sp denote a Color Total Variation, a Group Sparsity (12-1-norm), an individual Total Variation and an individual Sparsity (11-norm), respectively, and the Color Total Variation, the Group Sparsity, the individual Total Variation and the individual Sparsity are defined as:

$$CTV(|x|) = \sqrt{\Sigma_n \Sigma k_{i=1}^k ((\nabla_1 |x^{(i)}[n]|)^2 + (\nabla_2 |x^{(i)}[n]|)^2)},$$

$$\|x\|_{2,1} = \Sigma_n \sqrt{\Sigma_{i=1}^k |x^{(i)}[n]|^2},$$

$$TV(|x^{(i)}|) = \Sigma n \sqrt{(\nabla_1 |x^{(i)}[n]|)^2 + (\nabla_2 |x^{(i)}[n]|)^2},$$

$$\|x^{(i)}\|_1 = \Sigma_n |x^{(i)}[n]|,$$

wherein functions CTV and GSp are applied jointly on all the multiple image contrasts, or the subset of the multiple image contrasts, TV and Sp functions are applied on each of the multiple image contrasts individually.

2. The method according to claim 1, wherein the CTV and the GSp are defined as;

$$CTV(|x|) = \Sigma_n \sqrt{\Sigma_{i=1}^k \mu_i ((\nabla_1 |x^{(i)}[n]|)^2 + (\nabla_2 |x^{(i)}[n]|)^2)},$$

$$\|x\|_{2,1} = \Sigma_n \sqrt{\Sigma_{i=1}^k \zeta_i |x^{(i)}[n]|^2},$$

where $\zeta_i$ and $\lambda_i$ are scaling parameters associated with unequal acceleration rates of different image contrasts.

3. The method according to claim 2, wherein for parallel imaging, sensitivity maps of each coil of the MRI system is assumed to be known and the transformation matrix of $A_i$ is updated to comprise the sensitivity maps.

4. The method according to claim 2, the optimization algorithm is an Alternating Direction Method of Multipliers (ADMM), a Conjugate Gradient or an Augmented Lagrangian.

5. The method according to claim 1, wherein for parallel imaging, sensitivity maps of each coil of the MRI system is assumed to be known and the transformation matrix of $A_i$ is updated to comprise the sensitivity maps.

6. The method according to claim 1, the optimization algorithm is an Alternating Direction Method of Multipliers (ADMM), a Conjugate Gradient or an Augmented Lagrangian.

7. A method for reconstructing images of a magnetic resonance imaging (MRI) system comprising the steps of;
   acquiring with the MRI system, multiple images under an influence of different contrast mechanisms, wherein the different contrast mechanisms belong to a same anatomy,
   solving an optimization problem with an optimization algorithm using both joint and individual objective functions simultaneously for each of multiple image contrasts or a subset of the multiple image contrasts, to reconstruct the multiple images from acquired data,
   wherein the optimization problem solved with a synthesis based method is formulated as below with an approach considering a signal, a linear combination of basis atoms of a dictionary;

$$\|A_i \cdot (\hat{x}_i^{(1)} + \hat{x}_i^{(2)}) - y_i\|_2^2 < \epsilon$$

$$\min_{\hat{x}_i^{(1)}, \hat{x}_i^{(2)}} \alpha CTV(|\hat{x}^{(1)}|) + \beta GSp(|\hat{x}^{(1)}|) + \sum_i \gamma TV(|\hat{x}_i^{(2)}|) + \sum_i \theta Sp(|\hat{x}_i^{(2)}|)$$

where $A_i$ denotes a transformation matrix, wherein the transformation matrix maps samples of an image to the samples in a data domain, and the data domain comprises a Fourier domain, $\hat{x}_i$ denotes a reconstructed image, and $y_i$ denotes associated acquired data for each of the multiple image contrasts; CTV, GSp, TV, and Sp denote a Color Total Variation, a Group Sparsity (12-1-norm), an individual Total Variation and an individual Sparsity (11-norm), respectively, and the Color Total Variation, the Group Sparsity, the individual Total Variation and the individual Sparsity are defined as:

$$CTV(|x|) = \Sigma_n \sqrt{\Sigma k_{i=1}^k ((\nabla_1 |x^{(i)}[n]|)^2 + (\nabla_2 |x^{(i)}[n]|)^2)},$$

$$\|x\|_{2,1} = \Sigma_n \sqrt{\Sigma_{i=1}^k |x^{(i)}[n]|^2},$$

$$TV(|x^{(i)}|) = \Sigma n \sqrt{(\nabla_1 |x^{(i)}[n]|)^2 + (\nabla_2 |x^{(i)}[n]|)^2},$$

$$\|x^{(i)}\|_1 = \Sigma_n |x^{(i)}[n]|.$$

8. The method according to claim 7, wherein for parallel imaging, sensitivity maps of each coil of the MRI system is assumed to be known and a transformation matrix of $A_t$ is updated to comprise the sensitivity maps.

9. The method according to claim 7, the optimization algorithm is an Alternating Direction Method of Multipliers (ADMM), a Conjugate Gradient or an Augmented Lagrangian.

10. A method for reconstructing images of a magnetic resonance imaging (MRI) system comprising the steps of;
  acquiring with the MRI system, multiple images under an influence of different contrast mechanisms, wherein the different contrast mechanisms belong to a same anatomy,
    solving an optimization problem with an optimization algorithm using both joint and individual objective functions simultaneously for each of multiple image contrasts or a subset of the multiple image contrasts, to reconstruct the multiple images from acquired data,
  wherein a total generalized variation (TGV), and/or l1-norm of a Wavelet transformation of the multiple images is employed as the joint and individual objective functions.

11. The method according to claim 10, the optimization algorithm is an Alternating Direction Method of Multipliers (ADMM), a Conjugate Gradient or an Augmented Lagrangian.

12. The method according to claim 10, wherein for parallel imaging, sensitivity maps of each coil of the MRI system is assumed to be known and a transformation matrix of $A_t$ is updated to comprise the sensitivity maps.

\* \* \* \* \*